United States Patent [19]
Peng

[11] Patent Number: 6,133,110
[45] Date of Patent: Oct. 17, 2000

[54] METHOD OF MANUFACTURING A DUAL CYLINDER-SHAPED CAPACITOR

[75] Inventor: Nai-Chen Peng, Hsinchu, Taiwan

[73] Assignee: United Microelectronics Corp., Hsinchu, Taiwan

[21] Appl. No.: 09/127,998

[22] Filed: Jul. 31, 1998

[30] Foreign Application Priority Data

May 22, 1998 [TW] Taiwan .................................. 87107995

[51] Int. Cl.⁷ .................................................. H01L 21/20
[52] U.S. Cl. .......................... 438/397; 438/253; 438/254; 438/255; 438/396; 438/398
[58] Field of Search ..................... 438/253, 254, 438/255, 396, 397, 398

[56] References Cited

U.S. PATENT DOCUMENTS

5,399,518  3/1995  Sim et al. .................................. 437/52

*Primary Examiner*—David Nelms
*Assistant Examiner*—Quoc Hoang
*Attorney, Agent, or Firm*—Hickman Coleman & Hughes, LLP

[57] ABSTRACT

A method of manufacturing a dual cylinder-shaped capacitor. The method includes the steps of forming a cylindrical oxide layer above a conductive layer, and then forming silicon nitride spacers and first oxide spacers on the sidewalls of the cylindrical oxide layer. Next, using the silicon nitride spacers, the first oxide spacers and the cylindrical oxide layer as a hard mask, the conductive layer is etched to form a separate lower electrode. Thereafter, the oxide layer is removed so that only the silicon nitride spacers remain. Subsequently, second oxide spacers and third oxide spacers are formed on the sidewalls of the silicon nitride spacers. Finally, the silicon nitride spacers are removed, and then the conductive layer is again etched to form the dual cylinder-shaped lower electrode.

31 Claims, 13 Drawing Sheets

METHOD OF MANUFACTURING A DUAL CYLINDER-SHAPED CAPACITOR

CROSS-REFERENCE TO RELATED APPLICATION

This application claims the priority benefit of Taiwan application serial no. 87107995, filed May 22, 1998, the full disclosure of which is incorporated herein by reference.

BACKGROUND OF THE INVENTION

1. Field of Invention

The present invention relates to an integrated circuit structure and its manufacturing method. More particularly, the present invention relates to the structure and manufacturing method of a dynamic random access memory (DRAM) capacitor.

2. Description of Related Art

As microprocessors become more powerful and the amount of computation capable of being processed by software programs increases, required memory capacity increases correspondingly. Following the increase in level of integration of DRAM devices, a memory cell now comprises a transfer field effect transistor (TFET) and a storage capacitor, only.

Figure 1:
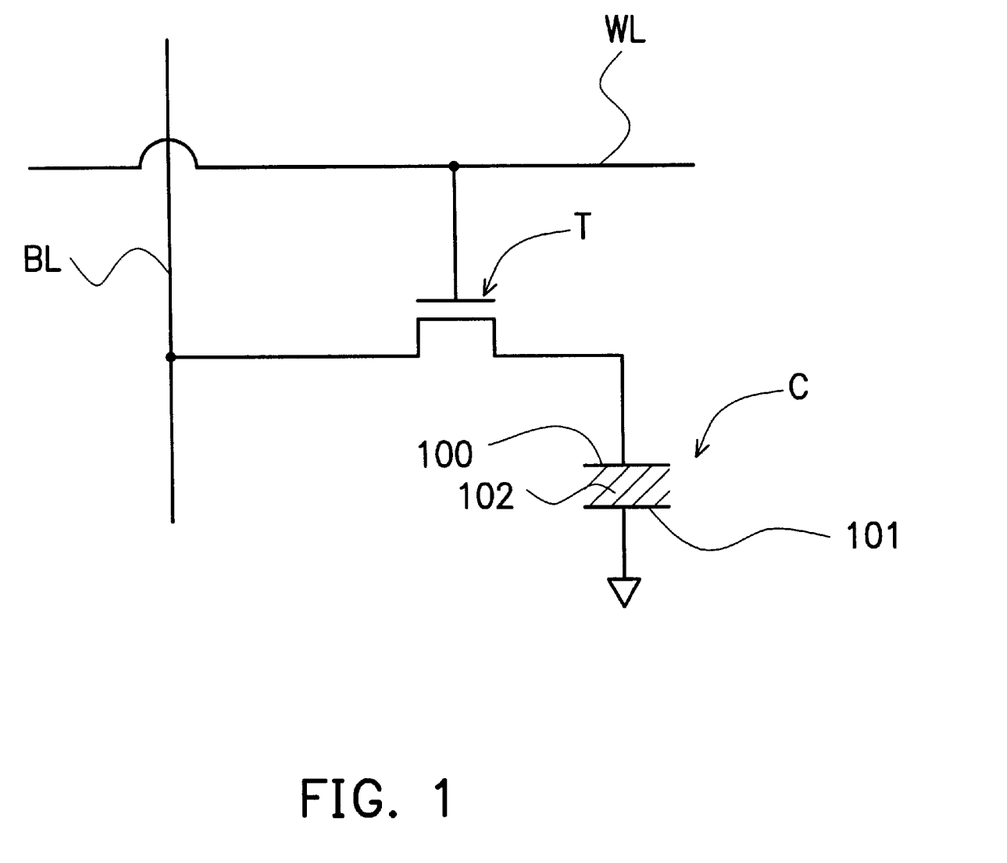
FIG. 1 is an equivalent circuit diagram of a DRAM cell.

FIG. 1 is an equivalent circuit diagram of a DRAM cell. As shown in FIG. 1, when one of the capacitors C in an array of capacitors on a semiconductor substrate is selected, the charging state of the capacitor C can be used for storing a bit of data. Normally, a single bit is stored in a capacitor in a binary system. When the capacitor C is free of charge, logic "0" is implied, whereas when the capacitor is fully charged, logic "1" is implied.

In general, a dielectric layer 102 is deposited between the upper electrode (cell electrode) 101 and the lower electrode (storage electrode) 100 of the capacitor C providing the necessary dielectric constant. Furthermore, the capacitor C is electrically coupled to a bit line BL, and read/write operations are carried out by charging/discharging the capacitor C. The transfer field effect transistor T is a switch for carrying out the necessary charging or discharging of the capacitor C.

The transistor T is able to function as a switch because the bit line BL is connected to the source terminal of transistor T while the drain terminal of transistor T is connected to the capacitor C. In addition, a word line WL is connected to the gate terminal of the transistor T so that a control signal can be sent to turn on or off the connection from the bit line BL to the capacitor C.

For DRAM having a storage capacity less than 1M (1 Megabit), two-dimensional capacitors commonly known as planar type capacitors are generally formed in integrated circuits. Since a planar type capacitor occupies vast semiconductor substrate area, it is not suitable for forming highly integrated circuits. Therefore, three-dimensional capacitors are used in almost every highly integrated circuit, such as memory with a storage capacitor bigger than 4M. In general, three-dimensional capacitors can be classified roughly into a stacked type or a trench type.

Compared with a planar type of capacitor, a stacked or trench capacitor is capable of providing a relatively large capacitance even when the size of a memory cell is further shrunk. However, when the level of memory device integration is further reduced, for example, DRAM having memory capacity greater than 64K, simple three-dimensional structures are still incapable of providing the necessary capacitance.

As size of each memory cell decreases, capacitance of its storage capacitor will also decrease. When the capacitance of a capacitor decreases, probability of soft errors caused by α-ray increases accordingly.

One method of increasing overall surface area of a capacitor and hence its capacitance is to allow the electrode and dielectric thin film to extend horizontally and to stack them one after another, thereby forming a fin-type stacked capacitor.

A second method of increasing overall surface area of a capacitor and hence its capacitance is to allow the electrode and dielectric thin film to extend vertically upward, thereby forming a cylindrical-type stacked capacitor structure.

As the level of integration continues to increase, the dimensions of each DRAM cell have to be reduced. Consequently, new storage capacitor structures and manufacturing methods capable of maintaining a constant capacitance despite a reduction in occupied area are being sought rigorously.

Figure 2A:
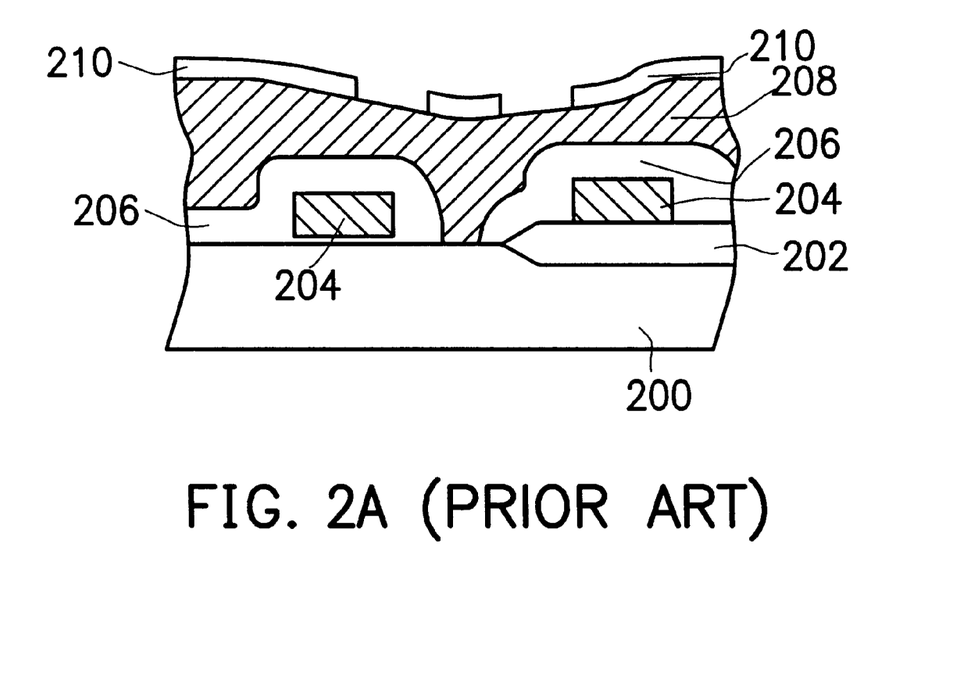
FIGS. 2A through 2E are cross-sectional views showing the progression of manufacturing steps in fabricating a dual cylinder-shaped capacitor according to a conventional method.

FIGS. 2A through 2E are cross-sectional views showing the progression of manufacturing steps in fabricating a dual cylinder capacitor according to a conventional method. First, as shown in FIG. 2A, an isolating field oxide layer 202, conductive structures 204, insulating layers 206 and polysilicon layer 208 are formed over a substrate 200. Next, silicon oxide is deposited over the substrate 200, and then the silicon oxide layer is patterned with a mask to form an oxide layer 210 having an opening that exposes a portion of the polysilicon layer 208.

Figure 2B:
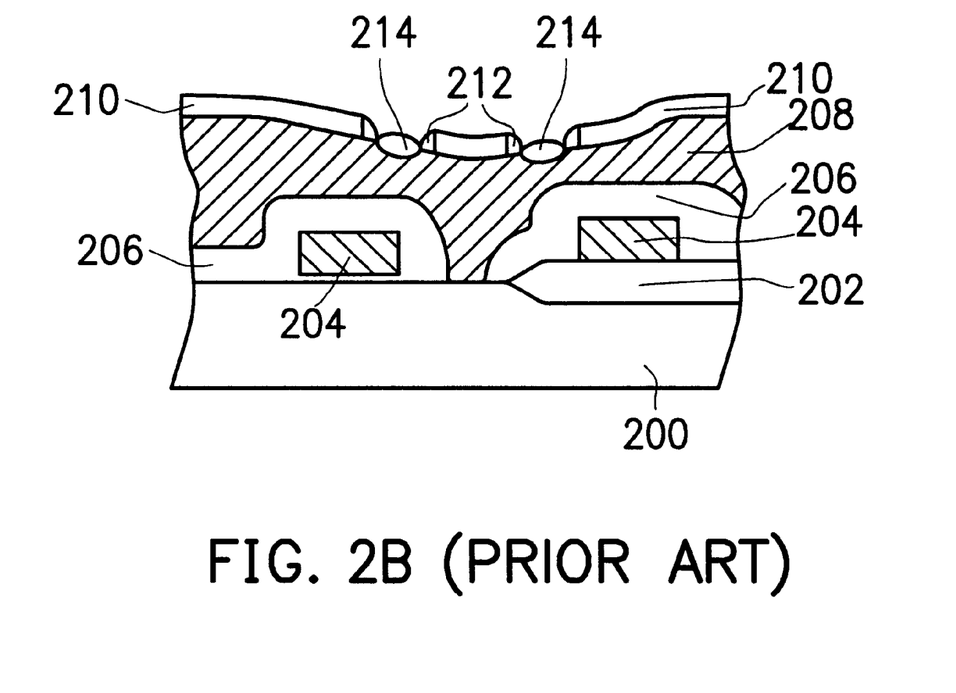

Thereafter, as shown in FIG. 2B, silicon nitride is deposited and then etched to form silicon nitride spacers 212 on the sidewalls of silicon oxide layer 210 on either side of the opening. Next, the exposed polysilicon layer 208 is oxidized using a thermal oxidation process so that a grainy oxide isolation layer 214 is formed in the narrow regions between the spacers 212.

Figure 2C:
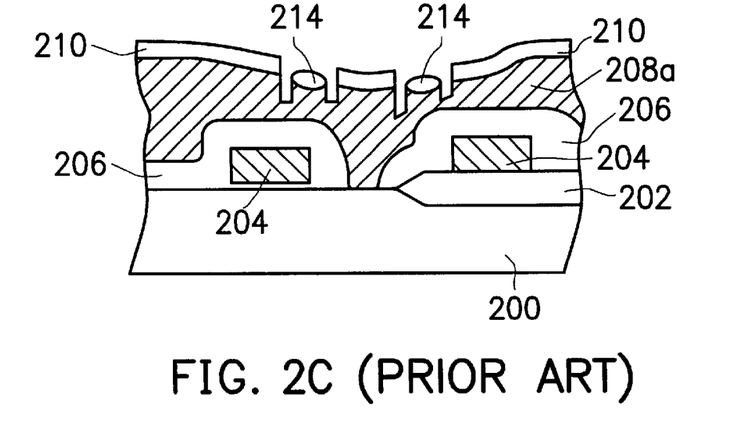

Subsequently, as shown in FIG. 2C, the silicon nitride spacers 212 are removed. Then, using the silicon oxide layer 210 and the oxide isolation layer 214 as masks, the polysilicon layer 208 is etched to form a polysilicon layer 208a having a number of trenches.

Figure 2D:
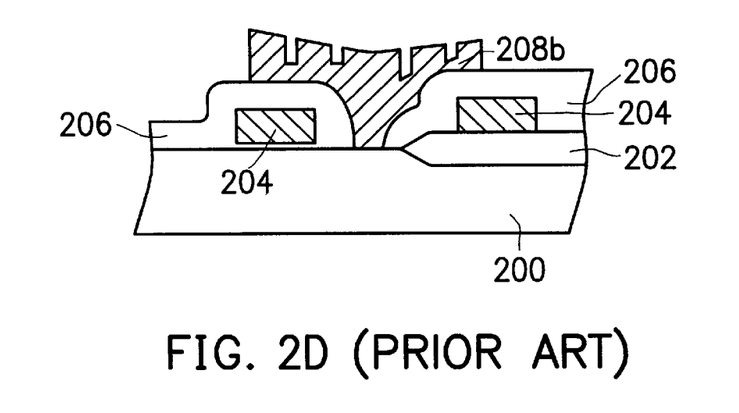
Figure 2E:
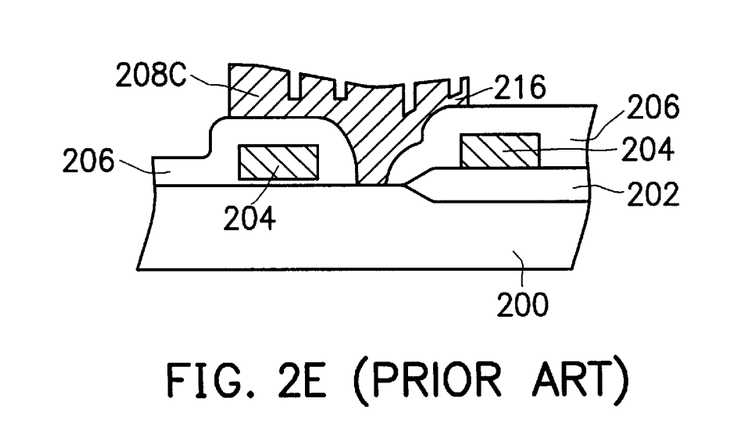

Next, as shown in FIG. 2D, the silicon oxide layer 210 and the oxide isolation layer 214 are removed. Thereafter, photolithographic and etching operations are used to remove a portion of the polysilicon layer 208a in the peripheral region in order to form a dual cylinder-shaped lower electrode structure 208b. Through carving out trenches in the polysilicon layer, additional surface area is obtained for the lower electrode 208b.

However, in the process of forming the lower electrode structure, photolithographic and etching operations have to be conducted when the opening is formed in the silicon oxide layer 210. Furthermore, more photolithographic and etching operations also have to be carried out when the neighboring lower electrode structures 208b are isolated. Therefore, if there is deviation in the above two photolithographic and etching operations, the peripheral structure of the dual cylinder electrode will have non-uniform width. The narrower side 216, shown in FIG. 2E, can easily break during subsequent processing operations and may lead to undesirable device properties.

In light of the foregoing, there is a need an improved method of fabricating dual cylinder electrodes.

SUMMARY OF THE INVENTION

Accordingly, the present invention provides a method of manufacturing dual cylinder-shaped capacitors capable of producing a dual cylinder electrode in one less photolithographic operation than the conventional method, thereby saving production cost. Moreover, the method used to form the dual cylinder electrode can prevent accidental breakage in the peripheral region of the electrode should photolithographic misalignment occur.

To achieve these and other advantages and in accordance with the purpose of the invention, as embodied and broadly described herein, the invention provides a method of manufacturing a dual cylinder-shaped capacitor. The method includes the steps of forming a silicon nitride layer over a substrate having source/drain regions, and then patterning the silicon nitride layer to expose the source/drain region. Next, a conductive layer is formed over the silicon nitride layer so that the source/drain region is electrically coupled. Thereafter, oxide is deposited over the conductive layer, and then the oxide layer is patterned to form a cylindrical oxide layer.

Subsequently, silicon nitride spacers and first oxide spacers are sequentially formed on the sidewalls of the cylindrical oxide layer. Next, using the cylindrical oxide layer, the silicon nitride spacers and the first oxide spacers as a hard mask, the conductive layer is etched to remove the exposed conductive layer until the silicon nitride layer is exposed. Then, the cylindrical oxide layer and the first oxide spacers are removed. In the subsequent step, second oxide spacers and third oxide spacers are formed on the respective sides of the silicon nitride spacers.

Next, the silicon nitride spacers are removed. Using the second spacers and the third spacers as masks, a portion of the conductive layer is etched away to form a dual cylinder-shaped lower electrode. After removing the second spacers and the third spacers, a dielectric thin film is formed over the lower electrode. Finally, an upper electrode is formed over the dielectric thin film to complete the process of manufacturing a DRAM capacitor.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIGS. 3A through 3L are cross-sectional views showing the progression of manufacturing steps in fabricating a dual cylinder-shaped capacitor according to one preferred embodiment of this invention.

Figure 3A:
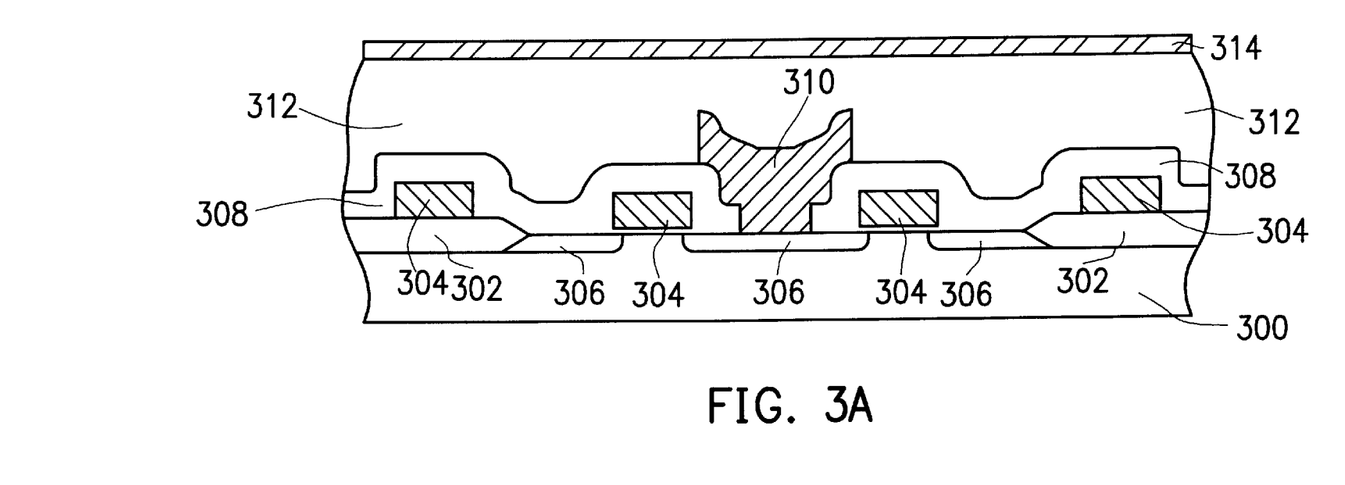
FIGS. 3A through 3L are cross-sectional views showing the progression of manufacturing steps in fabricating a dual cylinder-shaped capacitor according to one preferred embodiment of this invention.

First, as shown in FIG. 3A, a substrate 300 is provided. Then, isolating field oxide layers 302, conductive structures 304, source/drain regions 306, a first oxide layer 308 above the conductive structure, and a bit line 310 that passes through the first oxide layer 308 and electrically connects with the source/drain region 306, are formed above the substrate. Since the aforementioned layers are formed by the conventional method, detailed description is not repeated here.

Thereafter, a second oxide layer 312, preferably having a thickness of between 2000–20000 Å, is formed over the aforementioned structure using, for example, a chemical-vapor deposition method. Next, a silicon nitride layer 314 is formed over the planarized second oxide layer 312. The silicon nitride layer having a thickness of between 300–3000 Å can be formed using, for example, a chemical-vapor deposition method.

Figure 3B:
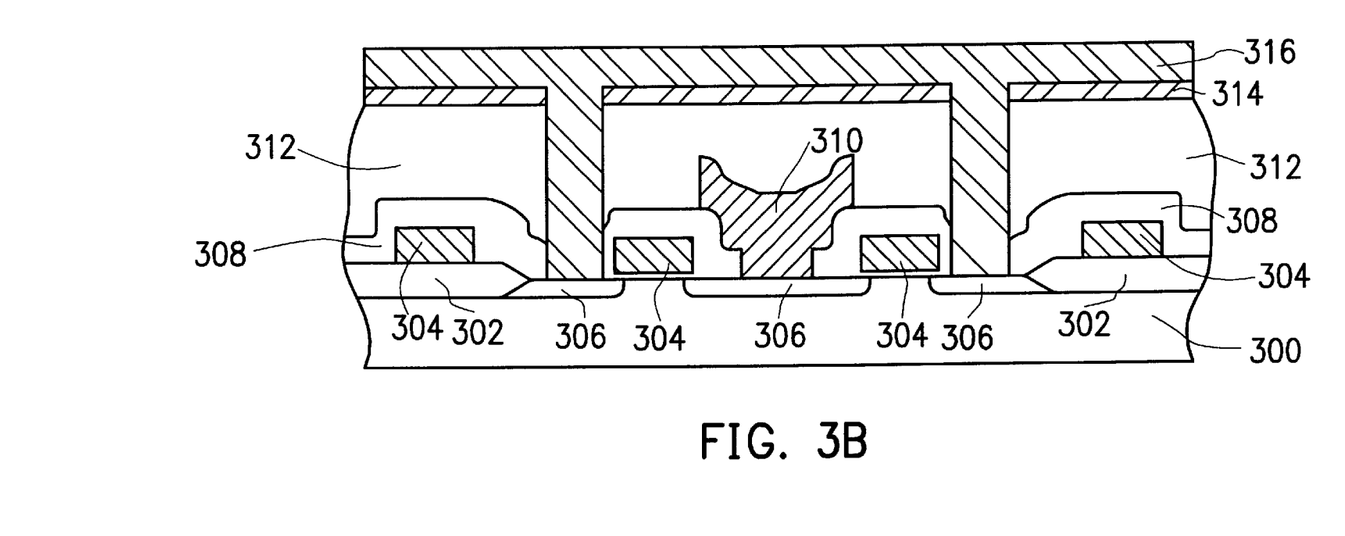

Next, as shown in FIG. 3B, photolithographic and etching operations are carried out to remove a portion of the silicon nitride layer 314, the second oxide layer 312 and the first oxide layer 308, and to expose source/drain regions that are not connected with a bit line 310. Thereafter, a conductive layer 316, which is, for example, a polysilicon layer, is formed over the silicon nitride layer 314 and makes electrical connection with the exposed source/drain region 306. The conductive layer 316 preferably has a thickness of between 3000–10000 Å.

Figure 3C:
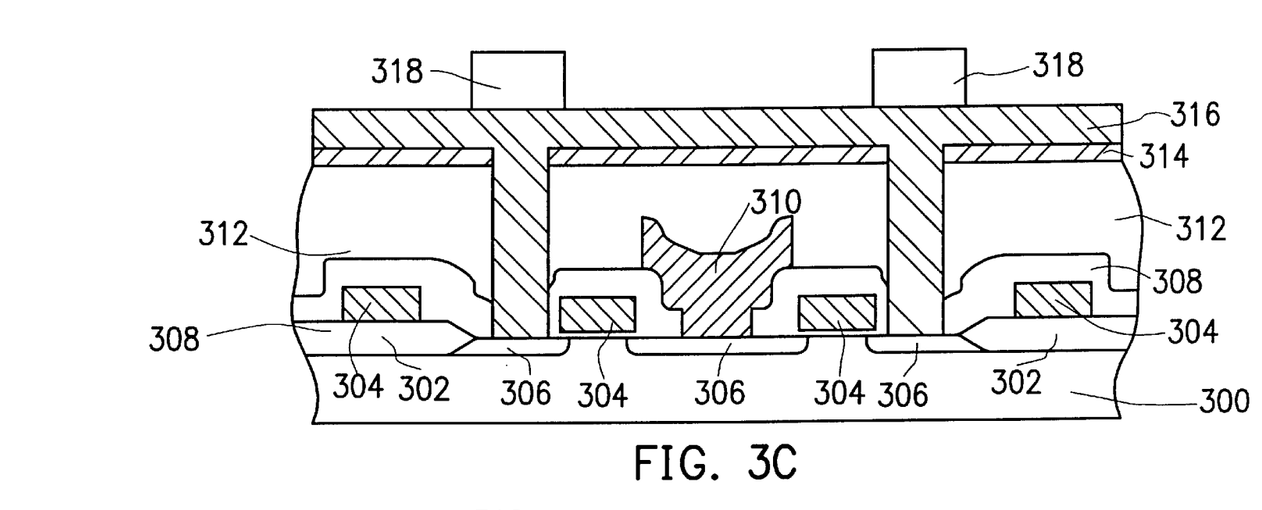

Next, as shown in FIG. 3C, an oxide layer having a thickness of between 1000–8000 Å is formed over the conductive layer 316. Then, photolithographic and etching operations are used to form cylindrical oxide layers 318 above the conductive layer 316. The cylindrical oxide layers 318 are formed above the conductive layer 316 in regions that correspond to the positions.

Figure 3D:
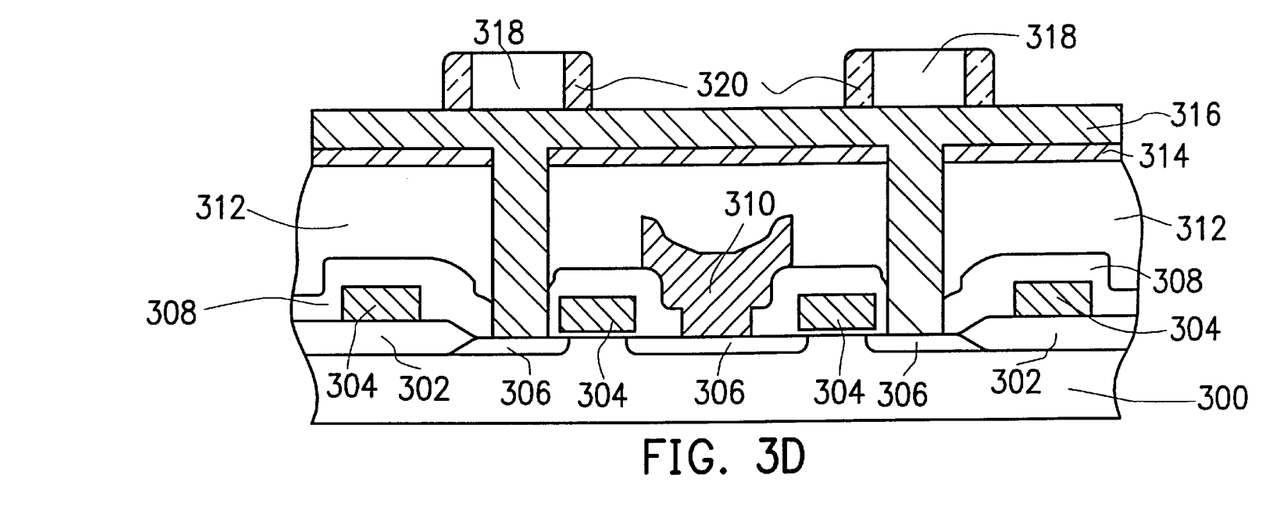

Next, as shown in FIG. 3D, silicon nitride spacers 320 are formed on the sidewalls of the cylindrical oxide layers 318. The silicon nitride spacers 320 can be formed by first depositing a silicon nitride layer preferably having a thickness of between 1000–3000 Å over the structure as shown in FIG. 3C, and then using reactive ion etching method to etch the silicon nitride layer.

Figure 3E:
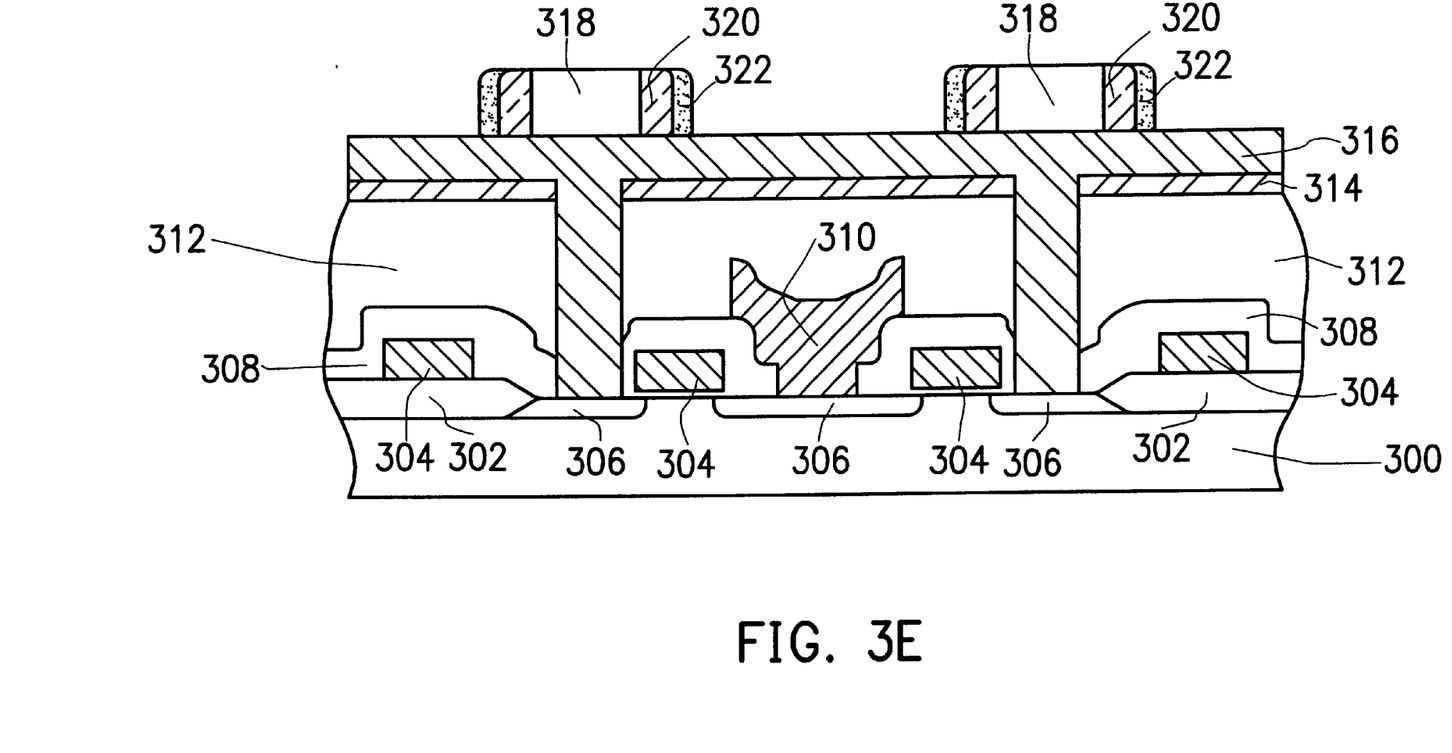

Thereafter, as shown in FIG. 3E, first oxide spacers 322 are formed on the sidewalls of the silicon nitride spacers 320. The first oxide spacers are formed by first depositing silicon oxide over the structure as shown in FIG. 3D to a thickness of between 1000–3000 Å. Then, the silicon oxide layer is etched using a reactive ion etching method.

Figure 3F:
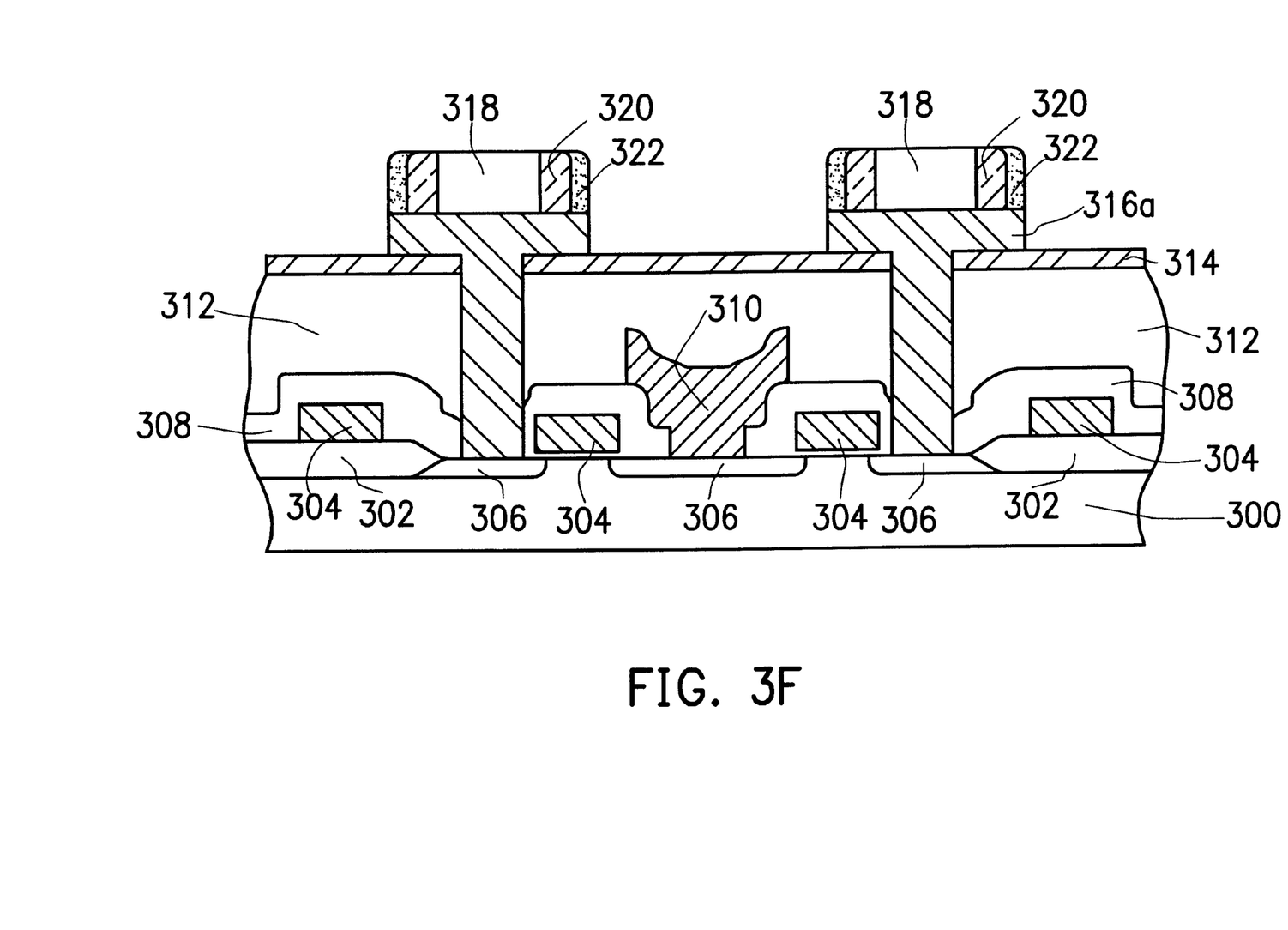
Figure 3G:
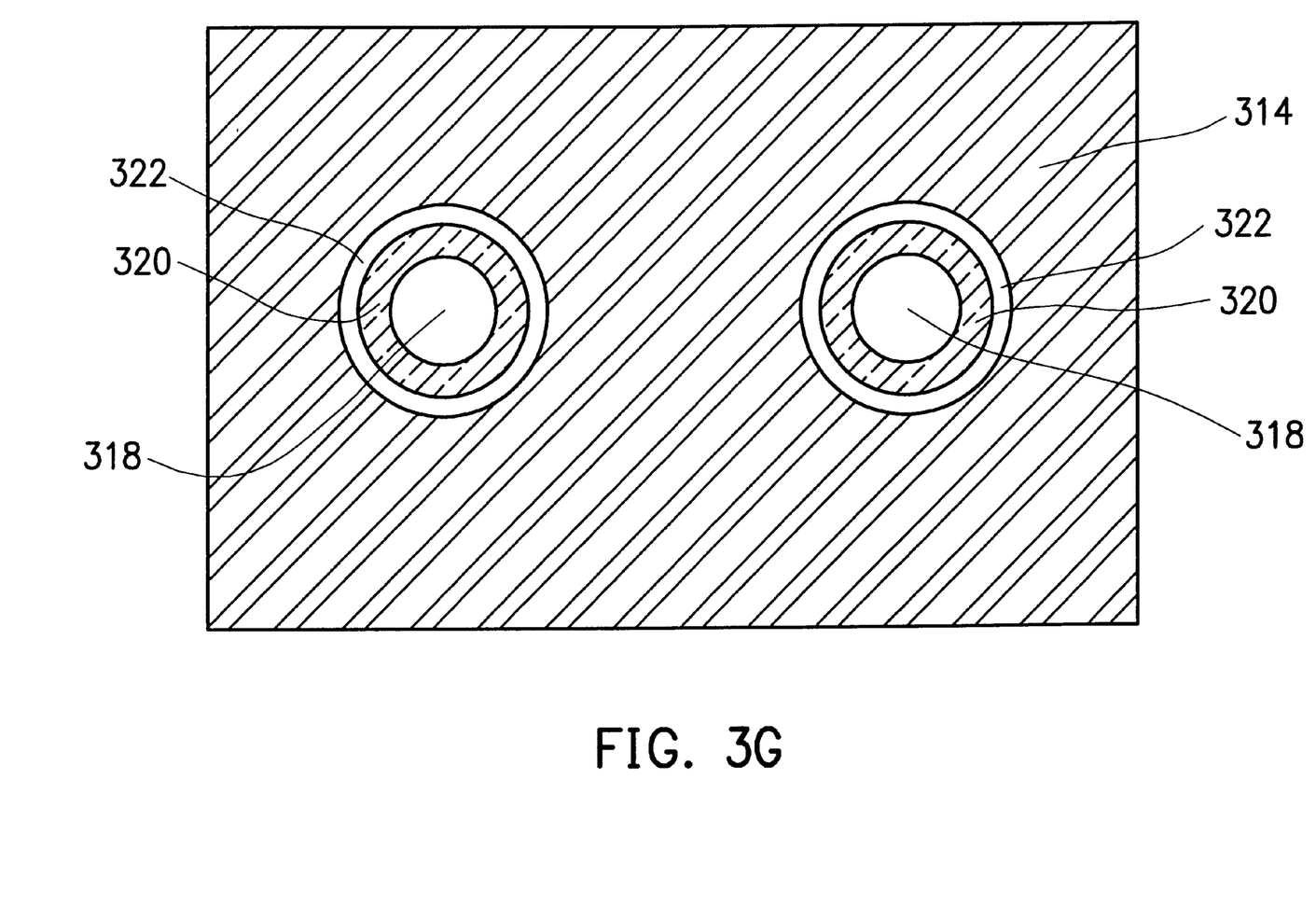

Next, as shown in FIG. 3F, using the cylindrical oxide layer 318, the silicon nitride spacers 320 and the first oxide spacers 322 as a hard mask, the conductive layer 316 is etched until the silicon nitride layer 314 is exposed. Those portions of the conductive layer 316a covered by the hard mask remain and later serve as part of the lower electrode of a capacitor. FIG. 3G is a top view showing the shape and structure of the cylindrical oxide layer 318, the silicon nitride spacers 320 and the first oxide spacers 322. As shown in FIG. 3G, the silicon nitride spacer 320 has a ring structure enclosing the cylindrical oxide layer 318. The first oxide spacer 322 also has a ring structure enclosing the exterior periphery of the silicon nitride spacer 320.

Figure 3H:
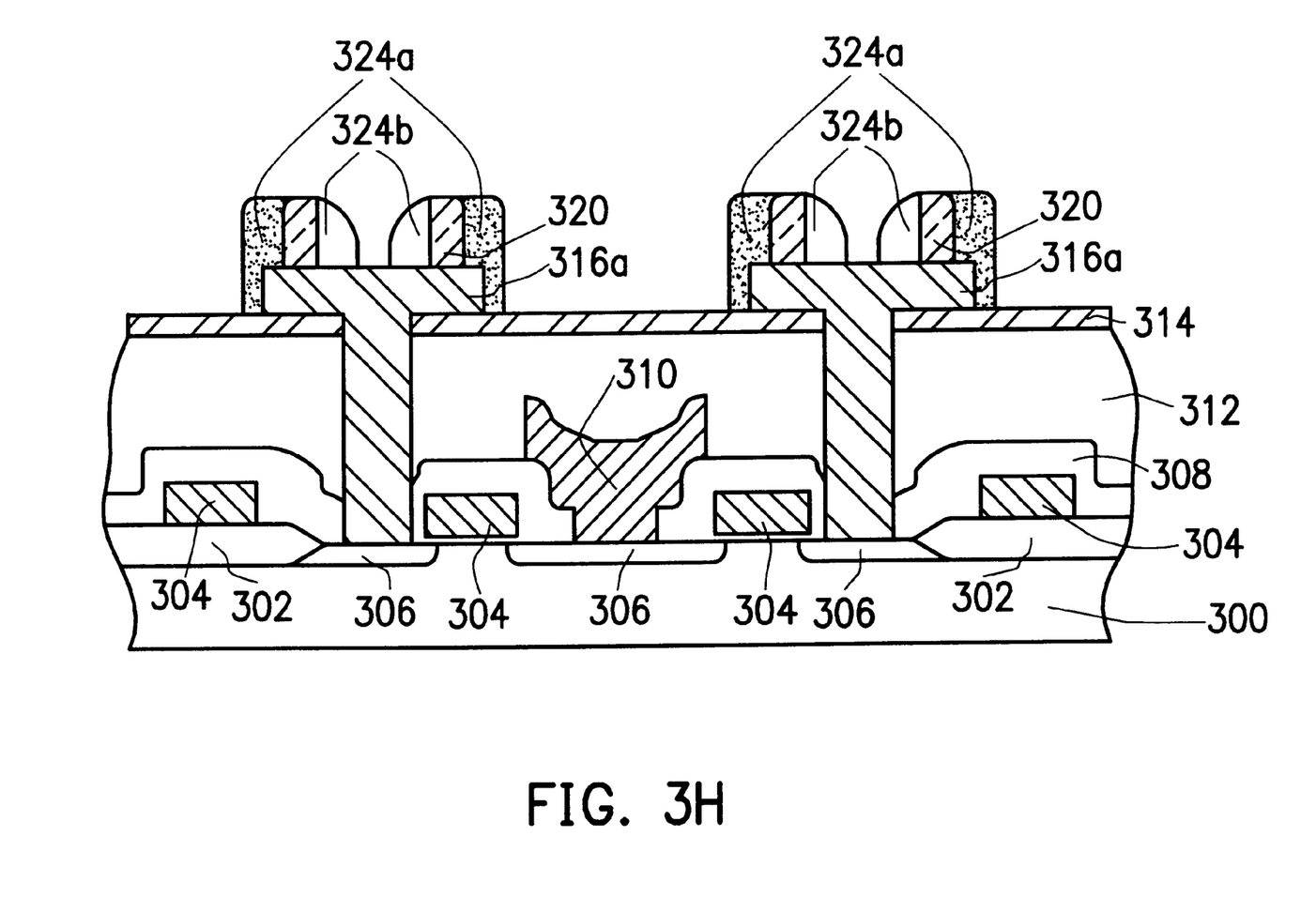

Thereafter, as shown in FIG. 3H, the cylindrical oxide layers 318 and the first oxide spacers 322 are removed so that only the silicon nitride spacers 320 remain. The oxide layers can be removed using hydrofluoric acid (HF). The silicon nitride layer 314 is able to protect the underlying oxide layer 312 from the acidic etchant while the oxide layers are being etched. After the oxide layers are removed, second oxide spacers 324a and third oxide spacers 324b are formed on each side of the silicon nitride spacers 320. The second oxide spacers 324a and the third oxide spacers 324b are formed by depositing a silicon oxide layer having a thickness of about 1000–3000 Å over the substrate structure. Then, the silicon oxide layer is etched using a reactive ion etching method. The second oxide spacers 324a cover not only the sides of the silicon nitride spacers 320, but also cover the sidewalls of the conductive layer 316a.

Figure 3I:
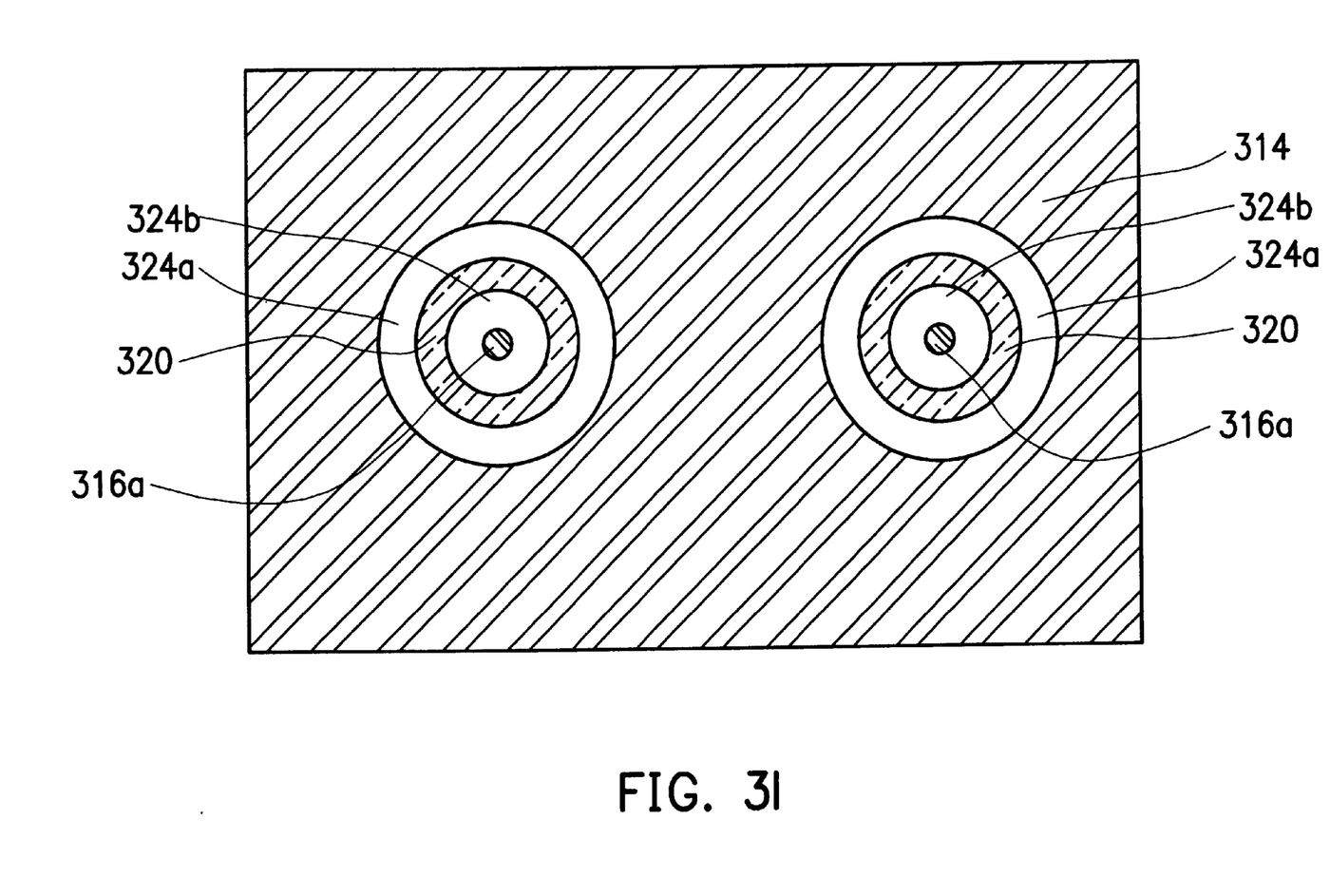

FIG. 3I is a top view showing the shape and structure of the silicon nitride spacers 320, the second oxide spacers 324a and the second oxide spacers 324b. As shown in FIG. 3I, each second oxide spacer 324a has a circular shape that encloses the silicon nitride spacer 320. The third oxide spacer 324b also has a circular shape enclosed within the silicon nitride spacers 320. However, the third oxide spacer 324b will not completely cover the conductive layer 316a after the cylindrical oxide layer 318 is removed. Consequently, a portion of the conductive layer 316a enclosed inside the circular third oxide spacer 324b is still exposed.

Figure 3J:
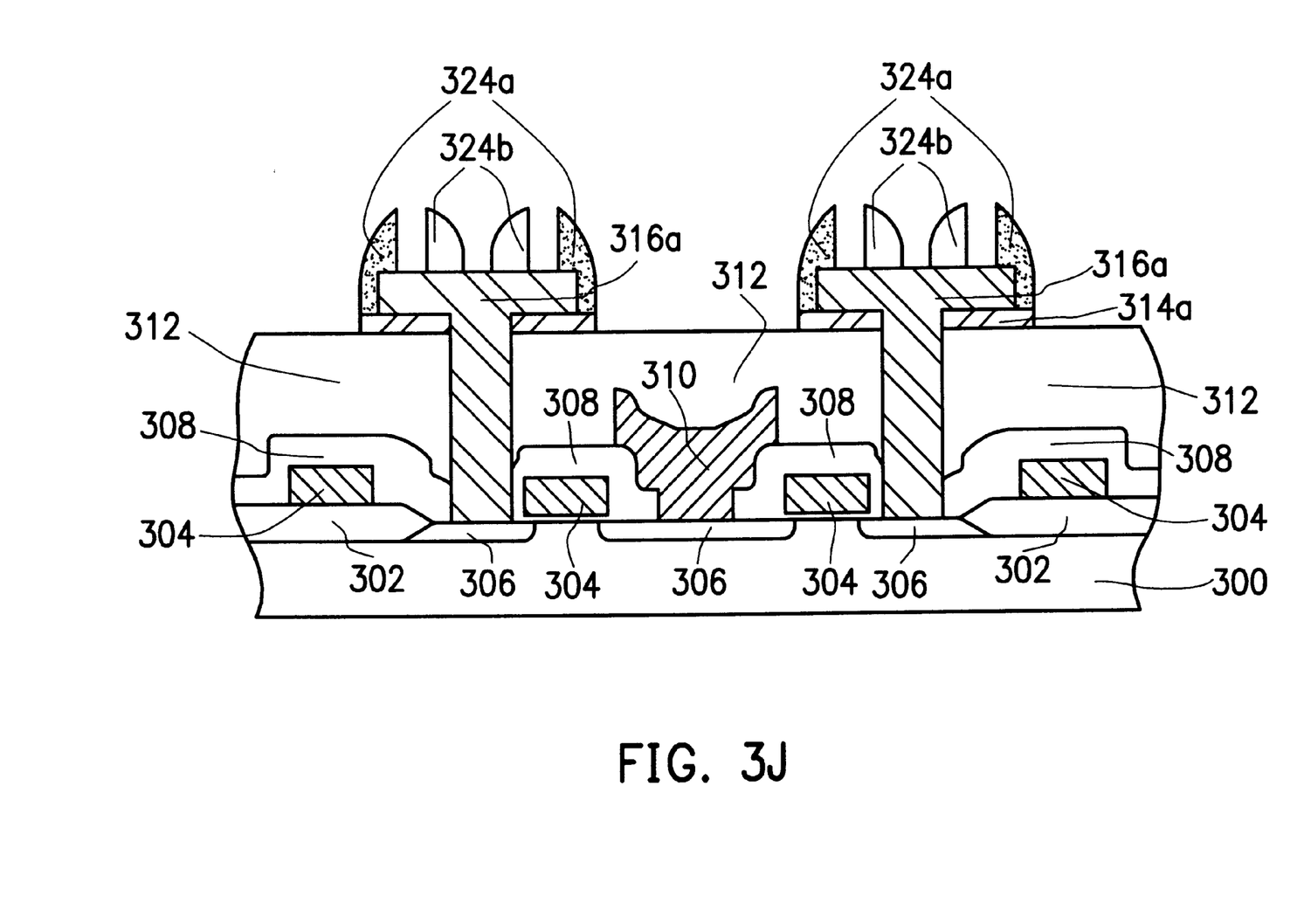

Next, as shown in FIG. 3J, the silicon nitride spacers 320 are removed. The silicon nitride spacers 320 can be removed using hot phosphoric acid. Beside the silicon spacers 320, a large portion of the silicon nitride layer 314 not covered by the second oxide spacers 324a is also removed. The only portion that remains is the silicon nitride layer 314a that lies below the conductive layer 316a and the second oxide spacers 324a.

Figure 3K:
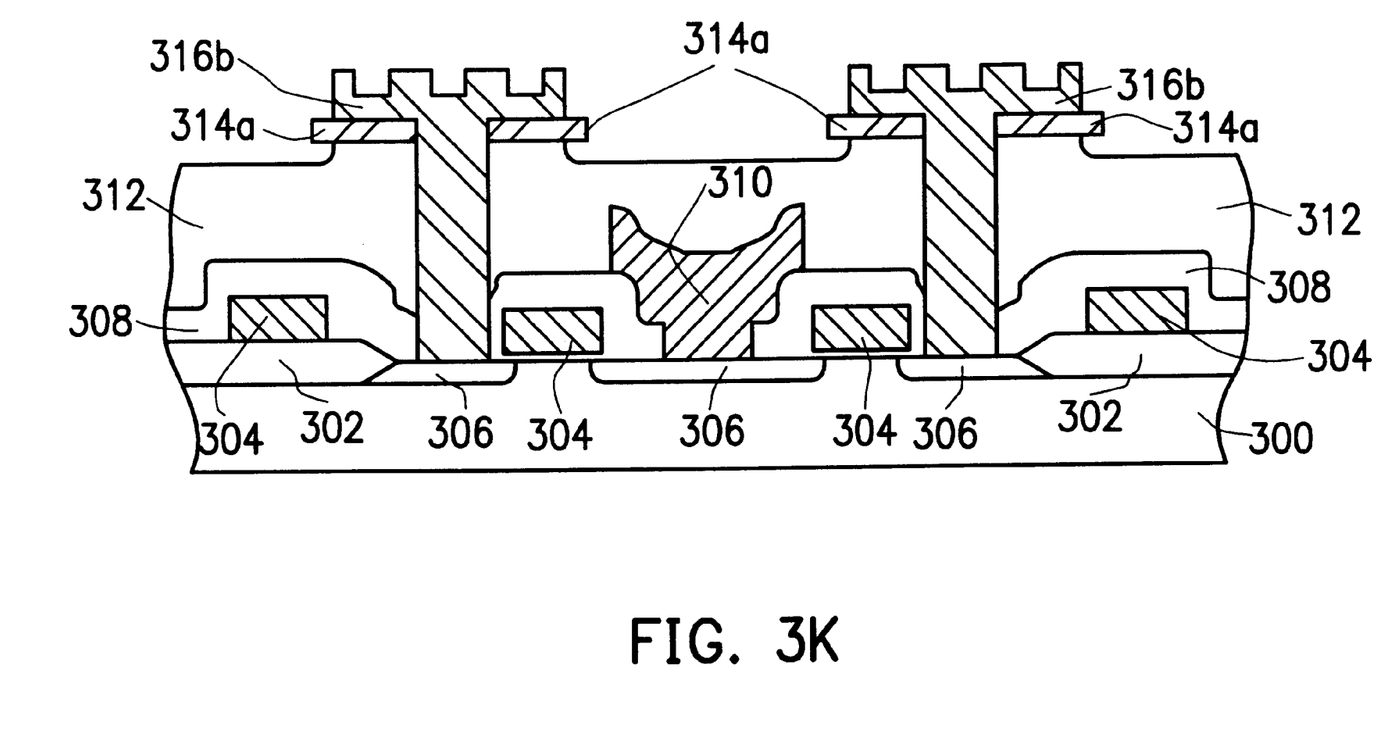

Thereafter, as shown in FIG. 3K, using the second oxide spacers 324a and the third oxide spacers 324b as masks, the exposed conductive layer 316a is etched until a half to one-third of the original thickness remains. Subsequently, the second oxide spacers 324a and the third oxide spacers 324b are removed using hydrofluoric acid. Finally, a dual cylinder-shaped conductive layer 316b that acts as the lower electrode of a capacitor is formed. Note that when the oxide spacers 324a and 324b are removed, a portion of the oxide layer 312 underneath the conductive layer 316b will also be removed due to exposure to the hydrofluoric acid.

Figure 3L:
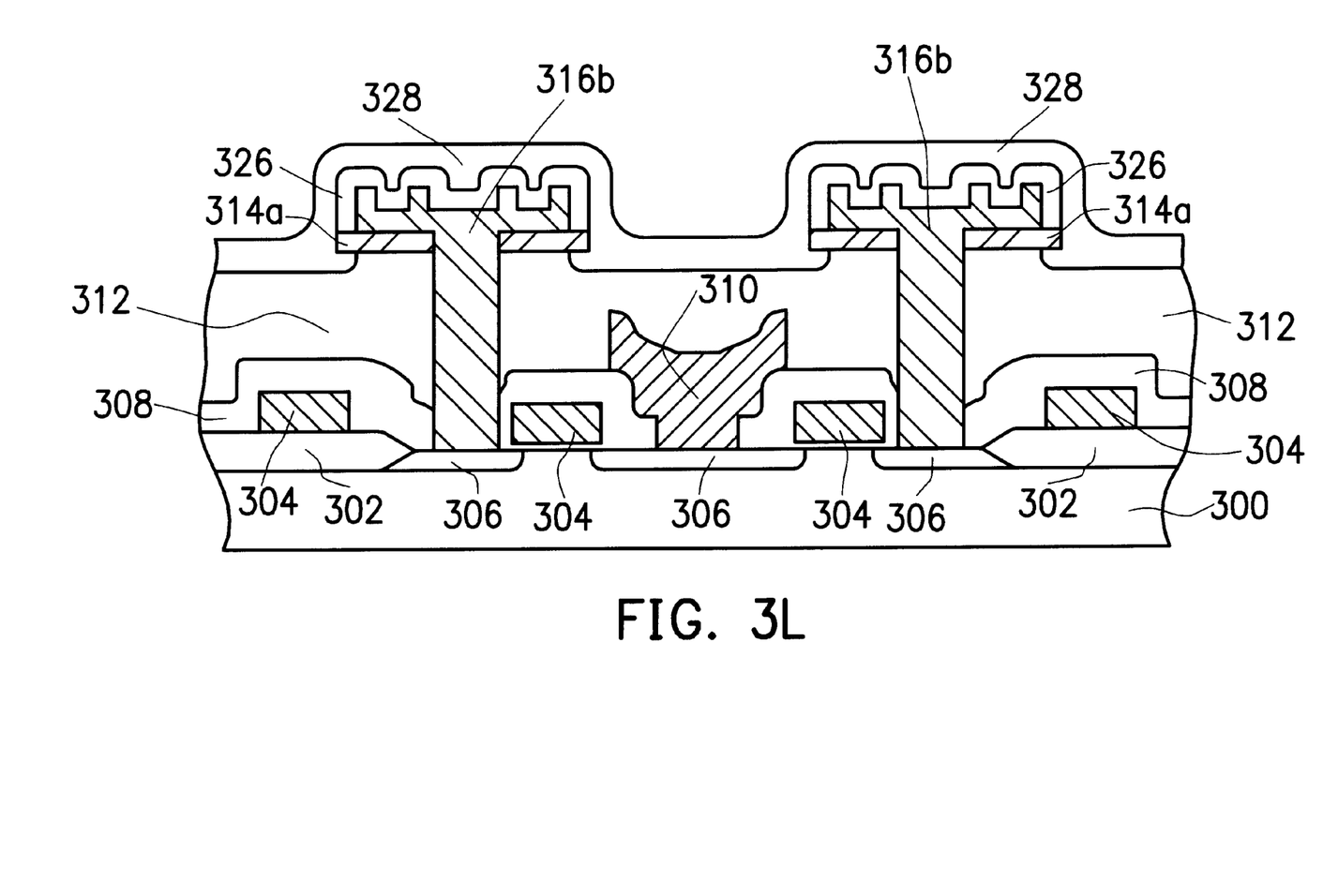

Finally, as shown in FIG. 3L, a dielectric thin film 326 having a thickness of about 60 Å is formed, covering the exposed surface of the dual cylinder-shaped conductive layer 316b. The dielectric thin film 326 preferably having a high dielectric constant can include layers of material, for example, an oxide/nitride/oxide composite layer, a nitride/oxide (NO) composite layer or a tantalum pentoxide layer ($Ta_2O_5$). Thereafter, an upper electrode 328 is formed above the dielectric thin film 326.

The embodiment of this invention can be applied to capacitor over bit-line (COB) and capacitor under bit-line (CUB) types of DRAMs. Although not specifically shown in FIG. 3L, anybody familiar with the fabricating process can apply conventional techniques to form the bonding pads, interconnections, passivation layers and finally package the devices to complete fabrication of DRAM integrated circuits. However, since these operations are not directly related to this invention, details are omitted here.

In this invention, only one photolithographic and etching operation is needed to form the cylindrical oxide layer. Therefore, the manufacturing operation requires one less photolithographic and etching operation than a conventional method, and hence is able to save some production cost. Moreover, since no photolithographic and etching operations are used when the conductive layer for forming the lower electrode is patterned, non-uniform thickness in the peripheral region of the dual cylinder electrode due to misalignment can be avoided.

In addition, even when the cylindrical oxide layer formed by the photolithographic and etching process does not attain the desired width due to poor photolithographic resolution, an isotropic etching operation employing hydrofluoric acid can always be used to modify the cylindrical oxide configuration. Consequently, etching of the conductive layer to form the dual cylinder electrode can be adjusted. Hence, the whole process of forming the dual cylinder-shaped lower electrode is not limited by conventional photolithographic techniques. In fact, the only limitation is in the resolution of the etching stations whose resolving power is normally much higher than a conventional photolithographic station.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a dual cylinder-shaped capacitor, the method comprising the steps of:

providing a substrate that has at least one source/drain region;

depositing silicon oxide over the substrate and then patterning the silicon oxide layer to expose the source/drain region;

forming a silicon nitride layer on the silicon oxide layer;

forming a conductive layer over the silicon oxide layer so that the source/drain region is electrically connected;

forming a cylindrical oxide layer above the conductive layer;

forming silicon nitride spacers on the sidewalls of the cylindrical oxide layer;

forming first oxide spacers on the sidewalls of the silicon nitride spacers:

removing a portion of the conductive layer to expose the silicon nitride layer;

removing the cylindrical oxide layer and the first oxide spacers;

forming a second oxide spacer and a third oxide spacer on each side of the silicon nitride spacer wherein the second oxide spacer covers a portion of the silicon nitride layer;

removing the silicon nitride spacers and the exposed silicon nitride layer so that the silicon nitride layer covered by the remaining conductive layer and the second spacer remains; and removing a portion of the conductive layer to form a dual cylinder-shaped lower electrode using the second oxide spacers and the third oxide spacers as masks.

2. The method of claim 1, wherein the silicon oxide layer has a thickness of between 2000–20000 Å.

3. The method of claim 1, wherein after the step of depositing and patterning the silicon oxide layer, further includes forming a silicon nitride layer.

4. The method of claim 3, wherein the step of removing the silicon nitride spacers further includes removing the exposed silicon nitride layer.

5. The method of claim 3, wherein the silicon nitride layer has a thickness of between 300–3000 Å.

6. The method of claim 1, wherein the step of forming the conductive layer includes depositing polysilicon.

7. The method of claim 6, wherein the polysilicon layer has a thickness of between 3000–10000 Å.

8. The method of claim 1, wherein cylindrical oxide layer has a thickness of between 1000–8000 Å.

9. The method of claim 1, wherein the silicon nitride spacer, the first oxide spacer, the second oxide spacer and the third oxide spacer all have thickness of between 1000–3000 Å.

10. The method of claim 1, wherein the step of removing a portion of the conductive layer to form the lower electrode includes removing a half to two-thirds of the total thickness of the conductive layer.

11. The method of claim 1, wherein the steps of removing the cylindrical oxide layer, the first oxide spacers, the second oxide spacers and the third oxide spacers include using hydrofluoric acid.

12. The method of claim 1, wherein the step of removing the silicon nitride spacers includes using hot phosphoric acid.

13. The method of claim 1, wherein after the step of forming the dual cylinder-shaped lower electrode, further includes forming a dielectric thin film and then an upper electrode over the exposed lower electrode surface.

14. The method of claim 13, wherein the step of forming the dielectric thin film includes depositing silicon oxide/silicon nitride/silicon oxide to form a composite layer.

15. The method of claim 13, wherein the step of forming the dielectric thin film includes depositing silicon nitride/silicon oxide to form a composite layer.

16. The method of claim 13, wherein the step of forming the dielectric thin film includes depositing tantalum pentoxide.

17. The method of claim 13, wherein the step of forming the upper electrode includes depositing polysilicon.

18. A method of manufacturing a dual cylinder-shaped capacitor, the method comprising the steps of:

providing a substrate that has at least one source/drain region;

depositing silicon oxide over the substrate;

forming a silicon nitride layer on the silicon oxide layer;

removing a portion of the silicon oxide layer and the silicon nitride layer to expose the source/drain region;

forming a polysilicon layer over the silicon oxide layer so that the source/drain region is electrically connected;

forming a cylindrical oxide layer above the polysilicon layer;

forming silicon nitride spacers on the sidewalls of the cylindrical oxide layer;

forming first oxide spacers on the sidewalls of the silicon nitride spacers;

removing a portion of the polysilicon layer to expose the silicon nitride layer;

removing the cylindrical oxide layer and the first oxide spacers;

forming a second oxide spacer and a third oxide spacer on each side of the silicon nitride spacer wherein the second oxide spacer covers a portion of the silicon nitride layer;

removing the silicon nitride spacers and the exposed silicon nitride layer so that the silicon nitride layer covered by the remaining conductive layer and the second spacer remains;

removing a half to two-thirds of the total thickness of the polysilicon layer to form a dual cylinder-shaped lower electrode using the second oxide spacers and the third oxide spacers as masks;

forming a dielectric thin film over the lower electrode; and forming an upper electrode over the dielectric thin film.

19. The method of claim 18, wherein the silicon oxide layer has a thickness of between 2000–20000 Å.

20. The method of claim 18, wherein after the step of depositing silicon oxide over the substrate, further includes forming a silicon nitride layer over the silicon oxide layer, and then removing a portion of the silicon nitride layer and the silicon oxide layer to expose the source/drain region.

21. The method of claim 20, wherein the silicon nitride layer has a thickness of between 300–3000 Å.

22. The method of claim 20, wherein the step of removing the silicon nitride spacers further includes removing the exposed silicon nitride layer.

23. The method of claim 18, wherein the polysilicon layer has a thickness of between 3000–10000 Å.

24. The method of claim 18, wherein the cylindrical oxide layer has a thickness of between 1000–8000 Å.

25. The method of claim 18, wherein the silicon nitride spacer, the first oxide spacer, the second oxide spacer and the third oxide spacer all have thickness of between 1000 Å to 3000 Å.

26. The method of claim 18, wherein the steps of removing the cylindrical oxide layer, the first oxide spacers, the second oxide spacers and the third oxide spacers include using hydrofluoric acid.

27. The method of claim 18, wherein the step of removing the silicon nitride spacers includes using hot phosphoric acid.

28. The method of claim 18, wherein the step of forming the dielectric thin film includes depositing silicon oxide/silicon nitride/silicon oxide to form a composite layer.

29. The method of claim 18, wherein the step of forming the dielectric thin film includes depositing silicon nitride/silicon oxide to form a composite layer.

30. The method of claim 18, wherein the step of forming the dielectric thin film includes depositing tantalum pentoxide.

31. The method of claim 18, wherein the step of forming the upper electrode includes depositing polysilicon.

* * * * *